(12) United States Patent
Gaskins et al.

(10) Patent No.: US 7,767,492 B1
(45) Date of Patent: Aug. 3, 2010

(54) LOCATION-BASED BUS TERMINATION FOR MULTI-CORE/MULTI-PACKAGE PROCESSOR CONFIGURATIONS

(75) Inventors: Darius D. Gaskins, Austin, TX (US); James R. Lundberg, Austin, TX (US)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 12/423,142

(22) Filed: Apr. 14, 2009

(51) Int. Cl.
*H01L 21/48* (2006.01)
(52) U.S. Cl. .................. 438/107; 710/113; 365/195; 326/30
(58) Field of Classification Search .............. 326/30, 326/26–27, 82–87; 438/107–109; 710/105–113; 714/25, 44; 365/195; 717/174
See application file for complete search history.

(56) References Cited

U.S. PATENT DOCUMENTS

| | | | |
|---|---|---|---|
| 5,926,031 A | 7/1999 | Wallace et al. | |
| 6,100,713 A | 8/2000 | Kalb et al. | |
| 6,160,417 A | 12/2000 | Taguchi | |
| 6,356,106 B1 | 3/2002 | Greeff et al. | |
| 6,496,880 B1 * | 12/2002 | Ma et al. | 710/38 |
| 6,836,143 B2 | 12/2004 | Song | |
| 6,971,049 B2 | 11/2005 | Bakke et al. | |
| 7,190,188 B2 * | 3/2007 | Otsuka et al. | 326/30 |
| 7,299,277 B1 * | 11/2007 | Moran et al. | 709/224 |
| 7,358,758 B2 * | 4/2008 | Gaskins et al. | 326/30 |
| 7,464,207 B2 * | 12/2008 | Riley et al. | 710/113 |
| 7,587,542 B2 * | 9/2009 | Riley et al. | 710/113 |
| 7,659,762 B2 * | 2/2010 | Schuelein | 327/218 |
| 7,675,806 B2 * | 3/2010 | Hunter et al. | 365/227 |
| 7,687,313 B2 * | 3/2010 | Karnezos | 438/107 |
| 2003/0016550 A1 | 1/2003 | Yoo et al. | |
| 2003/0039151 A1 | 2/2003 | Matsui | |
| 2003/0208646 A1 | 11/2003 | Muljono | |
| 2003/0221140 A1 | 11/2003 | Bakke et al. | |
| 2009/0100421 A1 * | 4/2009 | Flaming et al. | 717/174 |

\* cited by examiner

*Primary Examiner*—Lam T Mai
(74) *Attorney, Agent, or Firm*—Richard K. Huffman; James W. Huffman

(57) ABSTRACT

A multi-core/multi-package bus termination apparatus includes a first node, a location array, and a plurality of drivers. The first node receives a signal indicating whether a package upon which the processor core is disposed is internal to the bus or at a far end of the bus. The location array generates location signals indicating locations on the bus of nodes, where the locations are either an internal location or a bus end location. The drivers control how the nodes are driven. Each drivers has location-based multi-core/multi-package logic. The location-based multi-core/multi-package logic enables pull-up logic and first pull-down logic responsive to states of the first node ad the location signals.

21 Claims, 7 Drawing Sheets

LOCATION-BASED MULTI-CORE BUS TERMINATION

CONVENTIONAL OUTPUT DRIVER ON ASSISTED POINT-TO-POINT BUS

MECHANISM FOR MULTI-PROCESSOR ENVIRONMENT ON POINT-TO-POINT BUS

LOCATION-BASED MULTI-CORE BUS TERMINATION

LOCATION-BASED MULTI-CORE/MULTI-PACKAGE BUS TERMINATION

PROTOCOL-BASED MULTI-CORE BUS TERMINATION

LOCATION-BASED BUS TERMINATION FOR MULTI-CORE/MULTI-PACKAGE PROCESSOR CONFIGURATIONS

CROSS-REFERENCE TO RELATED APPLICATIONS

This application is related to the following co-pending U.S. Patent Applications, each of which has a common assignee and common inventors.

| Ser. No. | FILING DATE | TITLE |
| --- | --- | --- |
| 12/423,135 (CNTR.2476) | Apr. 14, 2009 | LOCATION-BASED BUS TERMINATION FOR MULTI-CORE PROCESSORS |
| 12/423,147 (CNTR.2479) | Apr. 14, 2009 | PROTOCOL-BASED BUS TERMINATION FOR MULTI-CORE PROCESSORS |
| 12/423,152 (CNTR.2484) | Apr. 14, 2009 | CONFIGURABLE BUS TERMINATION FOR MULTI-CORE/MULTI-PACKAGE PROCESSOR CONFIGURATIONS |

BACKGROUND OF THE INVENTION

1. Field of the Invention

This invention relates in general to the field of microelectronics, and more particularly to a mechanism for enabling and sustaining a multi-processor environment on a bus that requires active control of bus termination impedances, where the multi-processor environment includes processor package substrates having multiple processor dies disposed thereon.

2. Description of the Related Art

Many present day bus architectures provide only for a point-to-point bus interface between two devices such as a microprocessor and its corresponding memory controller in order to support very fast incident wave switching with a low output swing. In addition to providing only for a point-to-point interface, the architectures also require that the microprocessor (or other device) provide termination impedance control circuits within to dynamically adjust a termination impedance on the point-to-point bus, where the value of the impedance is generally selected to match the characteristic impedance of the bus itself.

In many applications, the value of the impedance is communicated to the device by coupling a precision resistor to an I/O pin on the device. Accordingly, the device provides drivers on-die that are configured to drive the point-to-point bus at the selected impedance value and at voltage levels in accordance with the bus specifications. These drivers provide for a properly terminated transmission line that supports the minimization of reflections, signal distortion, and other transmission line effects.

And while the point-to-point bus is effective for the case where only two devices communicate over the bus, the present inventors have noted for certain application areas such as a multi-processor application, more than one device may be required. In these applications, perhaps one to eight processors are required to interface in parallel to a memory controller over a bus as described above. In the future, it is anticipated that many more processors will be required to communicate over the same bus.

In U.S. Pat. No. 7,358,758, entitled APPARATUS AND METHOD FOR ENABLING A MULTI-PROCESSOR ENVIRONMENT ON A BUS, the present inventors addressed the above-noted problem by disclosing techniques for enabling multiple devices to be interfaced together over a bus that requires dynamic impedance controls. In one embodiment, an apparatus was provided for enabling a multi-device environment on a bus, where the bus requires active termination impedance control. The apparatus included a first node, configured to receive an indication that a corresponding device is at a physical end of the bus or that the corresponding device is an internal device. The apparatus also included multi-processor logic; coupled to the first node, configured to control how a second node is driven according to the indication, where the second node is coupled to the bus. The multi-processor logic enables pull-up logic and pull-down logic if the indication indicates that the corresponding device is at the physical end of the bus. The multi-processor logic disables the pull-up logic and enables the pull-down logic if the indication designates the corresponding device as an internal device. The pull-down logic drives the second node to a prescribed low voltage level regardless of whether the pull-up logic is enabled or disabled.

With the advent of so-called multi-core architectures, the present inventors have further noted a need in the art to address the need for active termination impedance control for a plurality of processor cores that are coupled together over a bus to a memory controller or other device, where the processor cores are each configured as a single processor die, and where two or more of these single processor dies are disposed on a single substrate within a multi-core processor package that is coupled to the bus. For purposes of the present disclosure, the term "multi-core processor" is defined to mean two or more single processor dies which are disposed on a single substrate. The single substrate may be multiple layers of interconnecting signals and other devices that provide for packaging of the multi-core processor and connectivity to the bus and other system-related signals.

The present inventors have moreover observed a need in the art to address the need for active termination impedance control for a plurality of multi-core processor packages, as described above, that are coupled together over a bus to a memory controller or other device.

But conventional bus architectures are limited because they require active impedance control without provisions for the use of multi-core processors. For example, when one processor core drives the bus described above, it would see an effective termination impedance that is developed by the parallel termination impedances of the other processor cores on the bus in addition to the other bus devices and, accordingly, driving I/O signals into this effective pull-up termination impedance would result in high frequency noise, reflections, ringing, timing displacements, and other disadvantages.

Consequently, the present inventors have observed that it is highly desirable to provide for inter-operation of a variable number of devices over a bus that requires active impedance control, where those devices include multi-core processors.

In addition, the present inventors have noted a need in the art for enabling a multi-core/multi-package environment over an actively controlled bus.

SUMMARY OF THE INVENTION

The present invention, among other applications, is directed to solving the above-noted problems and addresses other problems, disadvantages, and limitations of the prior art. The present invention provides a superior technique for enabling multi-core devices to be interfaced together over a bus that requires dynamic impedance controls. In one embodiment, an apparatus for enabling a multi-core/multi-package environment on a bus is provided, where the bus requires active termination impedance control. The apparatus includes a first node, a location array, and a plurality of drivers. The first node is disposed within a processor core and is configured to receive an external multi-package signal indicating whether a package upon which the processor core is disposed is internal to the bus or at a far end of the bus. The location array is disposed within the processor core and is configured to generate a plurality of location signals that indicate locations on the bus of a corresponding plurality of nodes that are coupled to the bus, where the locations comprise either an internal location or a bus end location. The plurality of drivers is coupled to the plurality of location signals. Each of the plurality of drivers has one of the corresponding plurality of nodes, and is configured to control how the one of the corresponding plurality of nodes is driven responsive to a first state of a corresponding one of the plurality of location signals and a second state of the first node. Each of the plurality of drivers has location-based multi-core/multi-package logic. The location-based multi-core/multi-package logic is configured to enable pull-up logic and first pull-down logic if the first state indicates the bus end location and the second state indicates that the package is at the far end, and is configured to disable the pull-up logic and enable the first pull-down logic and second pull-down logic if the first state indicates the internal location and the second state indicates that the package is at the far end, and is configured to disable the pull-up logic and enable the first pull-down logic and the second pull-down logic if the second state indicates that the package is internal to the bus.

One aspect of the present invention contemplates a microprocessor providing for a multi-core environment on a bus, where the bus requires active termination impedance control. The microprocessor includes a first node, location-based multi-core/multi-package logic, and a location array. The a first node is disposed within a processor core and configured to receive an external multi-package signal indicating whether a package upon which the processor core is disposed is internal to the bus or at a far end of the bus. The location-based multi-core/multi-package logic is disposed within a driver, and is configured to enable pull-up logic and first pull-down logic if a first state of one of a plurality of location signals indicates that a corresponding one of a plurality of nodes is at a bus end location and a second state of the first node indicates that the package is at the far end, and is configured to disable the pull-up logic and enable the first pull-down logic and second pull-down logic if the first state indicates the internal location and the second state indicates that the package is at the far end, and is configured to disable the pull-up logic and enable the first pull-down logic and second pull-down logic if the second state indicates that the package is internal to the bus. The location array is disposed within the processor core and coupled to the location-based multi-core/multi-package logic, and is configured to generate the plurality of location signals that indicate locations on the bus of the plurality of nodes, where the locations include either the internal location or the bus end location.

Another aspect of the present invention comprehends a method for enabling a multi-core/multi-package environment on a bus, the bus requiring active termination impedance control. The method includes, via a first node disposed within a processor core, receiving a first indication that a package upon which the processor core is disposed is internal to the bus or at a far end of the bus; via a location array disposed within a processor core, generating a second indication that one of a plurality of nodes is either internal to a bus or is at an end of the bus; and via location-based multi-core logic disposed within a driver, controlling how the one of a plurality of nodes is driven. The controlling includes, if the first indication designates the package as internal to the bus, disabling pull-up logic and first enabling first pull-down logic and second pull-down logic; if the first indication designates the package as at the end of the bus and the second indication designates the one of a plurality of nodes as being internal to the bus, disabling pull-up logic and first enabling first pull-down logic and second pull-down logic; and if the first indication designates the package as at the end of the bus and the second indication designates the one of the plurality of nodes as being at the end of the bus, third enabling the pull-up logic and the first pull-down logic.

BRIEF DESCRIPTION OF THE DRAWINGS

These and other objects, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
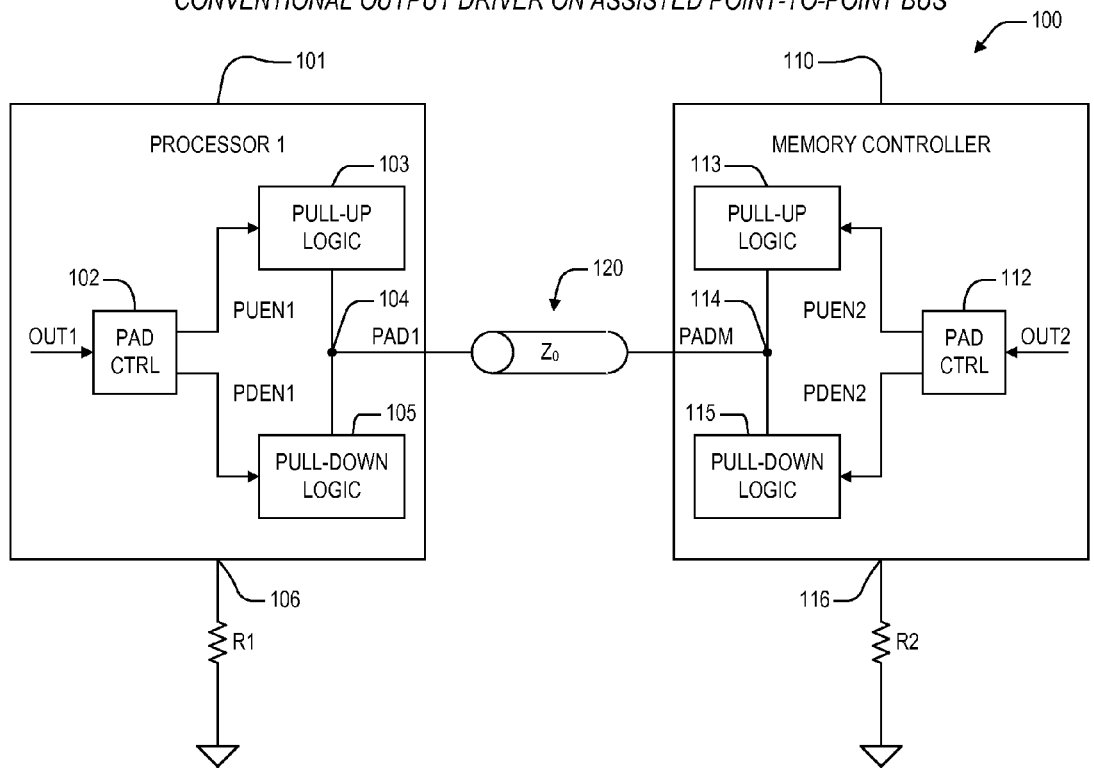
FIG. 1 is a block diagram illustrating a present day point-to-point bus that requires active control of bus termination impedances.
Figure 2:
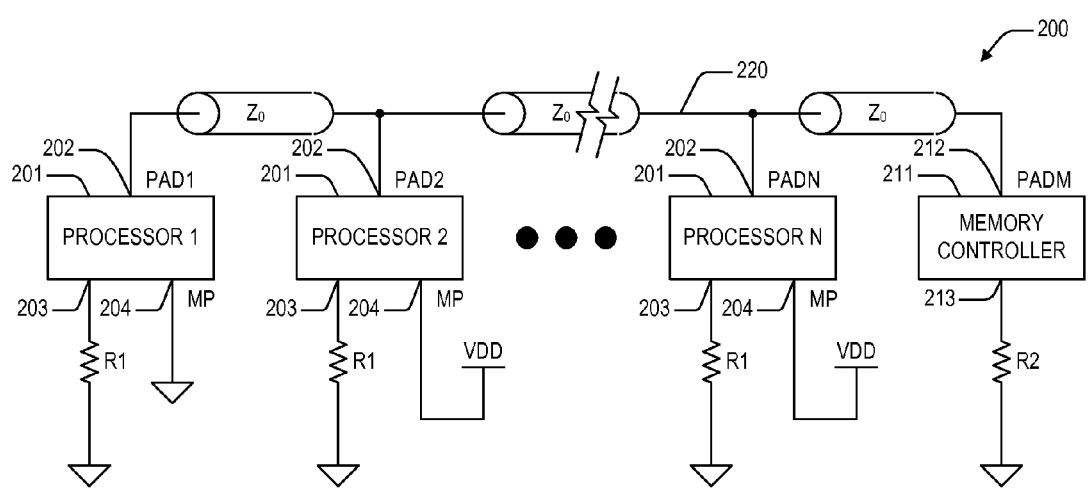
FIG. 2 is a block diagram depicting a present day multi-processor environment that is enabled over a bus like that of FIG. 1.
Figure 3:
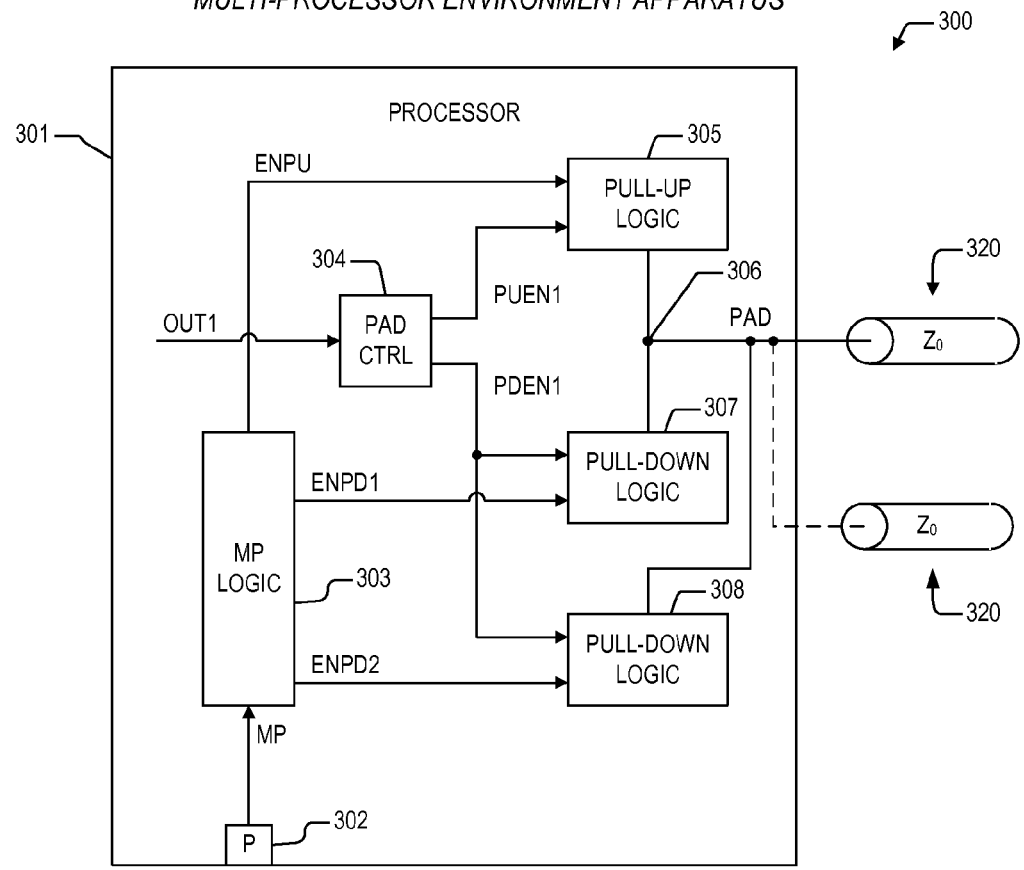
FIG. 3 is a block diagram featuring a present day multi-processor environment apparatus within a microprocessor.

In view of the above background discussion on bus interfaces and associated techniques employed within present day integrated circuits for transfer of data between devices, a discussion of the problems associated with actively terminated buses will be presented with reference to FIGS. 1-3. Following this, a discussion of the present invention will be presented with reference to FIGS. 5-7. The present invention overcomes the limitations of present day bus interface techniques by providing apparatus and methods for enabling multiple packages having multiple processor cores to be interfaced over a bus requiring active termination impedance control, while at the same time preserving the transmission line characteristics required.

Turning to FIG. 1, a block diagram 100 is presented illustrating a present day point-to-point bus 120, such as is provided for in many state-of-the-art microprocessor architectures. The block diagram depicts a present day processor 101 that is coupled to a memory controller 110 via the point-to-point bus 120. The memory controller 110 is depicted for illustrative purposes to teach limitations associated with the state-of-the-art and it is noted that any type of device (e.g., bus agent, memory hub, chipset, etc.) may be employed. A memory controller 110 is used in this discussion because it is representative of the type of device which is interfaced to a present day processor 101 over the point-to-point bus 120.

The processor 101 includes pad control logic 102 that receives a signal OUT1. The pad control logic 102 is coupled to pull-up logic 103 via a pull-up enable signal PUEN1 and to pull-down logic 105 via a pull-down enable signal PDEN1. The pull-up logic 103 and pull-down logic 105 are coupled together to form a pad node 104 developing a bidirectional pad signal PAD1. A resistor R1 is also coupled to the processor 101 at a node 106. In a present day processor 101, the node 106 typically is coupled to a pin (not shown) on a device package (not shown) of the processor to allow for ease of mounting to a motherboard or substantially similar form of packaging.

The memory controller 110 also has pad control logic 112 that receives a signal OUT2. The pad control logic 112 is coupled to pull-up logic 113 via a pull-up enable signal PUEN2 and to pull-down logic 115 via a pull-down enable signal PDEN2. The pull-up logic 113 and pull-down logic 115 are also coupled together to form a pad node 114 developing a bidirectional pad signal PADM. In like manner, a resistor R2 is coupled to the memory controller 111 at a node 116, which, like the processor 101, is typically coupled to a pin on a device package into which the memory controller 110 is encased.

The processor 101 interfaces to the memory controller 110 via the point-to-point bus 120 having a characteristic impedance $Z_0$. The interface specifically depicts signal PAD1 coupled to signal PADM (and their respective nodes 104, 114) over a single signal routing mechanism 120, shown as a transmission line 120 in the block diagram 100, but which typically comprises a trace 120 on a motherboard. For clarity purposes, nodes PAD1 and PADM are shown coupled together via the single trace 120. One skilled in the art will appreciate, however, that a present day bus 120 comprises many such signals substantially similar to those 104, 114 shown.

For certain application areas, including laptop, mobile, and networking applications, more than one processor 101 may not be required in a given system configuration. Consequently, to provide for very fast system bus speeds on a present day low voltage bus 120, system bus architectures at first changed from multi-processor environments to uniprocessor environments. The uniprocessor environment, as shown in the block diagram 100, includes active on-die (i.e., "on-chip") termination impedance control features. Whereas former multi-point architectures provided for termination of a bus signal external to devices on a bus, today's bus architectures require that bus termination impedances be provided for on-die and that such termination impedances be dynamically adjusted such that they are equal to or proportional to an externally provided precision resistance, depicted by resistors R1 and R2, that is located on a motherboard or substantially similar interconnection mechanism. This externally provided precision resistance R1, R2 is indicative of the transmission line characteristic impedance $Z_0$ exhibited by a trace 120 or signal path 120 on the motherboard which interconnects the first node (i.e., pin) PAD1 of a processor 101 to the second node PADM 114 of the memory controller 110.

Conventional bus protocols prescribe a required bus termination impedance. Typically, this impedance is communicated to the processor 101 and the memory controller 110, respectively, via the external resistors R1 and R2. In most cases, these two resistors R1, R2 are equal in value, but the values may differ in some configurations. A typical value for R1 and R2 is 27.5 ohms which indicates a 55 ohm characteristic impedance $Z_0$ of the interconnecting transmission lines 120 that make up the bus. Although R1 and R2 are shown in the block diagram 100 coupled to a ground reference, one skilled in the art will appreciate that the value of the voltage reference (e.g., VSS) to which the resistors R1-R2 are coupled may vary in accordance with the other voltages (not shown) that are provided to the processor 101 and memory controller 111 from a system power supply.

A properly terminated transmission line 120 that has no reflections has a parallel termination impedance at the far end of the signal trace 120 that is equal to the characteristic impedance $Z_0$ of the signal trace 120. Thus, in order to provide for proper terminations, the processor 101 and the memory controller 111 are required to dynamically control their respective impedances at nodes 104 and 114 as noted above such that the impedances are either equal to or proportional to R1 and R2, as prescribed by the specific bus protocol that governs the interface.

This dynamic control is typically accomplished via the pull-up logic 103, 113 and pull-down logic 105, 115 as shown. In one case, a signal on node PAD1 is active, or asserted, when it is pulled ("driven") to a specified low voltage level (not shown) through the pull-down logic 105. Accordingly, when PAD1 is asserted, a typical point-to-point bus protocol dictates that the pull-up logic 103 must be turned off. When PAD1 is not asserted, the pull-up logic 103 must be on, thus driving PAD1 up to a high voltage level (not shown). In addition, the typical protocol prescribes that only one device 101, 110—either the processor 101 or the memory controller 110—can be driving the bus 120 (i.e., pulling down the voltage on the bus 120 via pull-down logic 105, 115) at any given point in time. It is further required that the pull-up logic 103, 113 on both the processor 101 and the memory controller 110 be dynamically controlled to vary corresponding pull-up impedances such that they match the characteristic impedance $Z_0$ of the signal trace 120 on the motherboard (or other mechanism) that connects nodes PAD1 and PADM. Thus, when one of the devices 101, 111 drives the bus 120, and turns off its corresponding pull-up logic 103, 113, the driving device's pull-down logic 105, 115 generates a low going transition on the bus 120, that propagates down the transmission line environment of the signal trace 120 which is terminated at the far end by the other device's pull-up logic 113, 103.

The pull-down logic 105, 115 is configured to drive a signal on the bus 120 to the specified low voltage level. Accordingly, since the termination impedance developed by the other device 111, 101 at the far end of the bus 120 matches the characteristic impedance $Z_0$, disadvantageous transmission line effects such as high frequency noise, ringing, reflections, etc., are precluded. In a typical embodiment having a 55-ohm characteristic impedance $Z_0$, the pull-down logic 105, 115 is dynamically controlled to exhibit a 27.5 ohm impedance, thus driving a high voltage level of VH to a low voltage level VL that is approximately one-third of VH. This allows the pull-down logic 105, 115 to develop a low voltage level VL that is sufficiently immune to noise on the bus 120. The manner in which the pull-down logic 105, 115 dynamically controls the impedance is beyond the scope of this application.

To summarize, on a point-to-point bus 120, when the bus 120 is not being driven low by a device 101, 110, then the device's pull-up logic 103, 113 must drive its corresponding node PAD1, PADM to a high voltage level VH according to a prescribed bus termination impedance. When a node PAD1, PADM on the bus 120 is driven low by a given device 101, 110, the given device 101, 110 must turn off its pull-up logic 103, 113 and turn on its pull-down logic 105, 115 to present a prescribed pull-down impedance. By doing so, since the opposite device's pull-up logic 113, 103 is on, the transmission line 120 is properly terminated so that there are no reflections and proper bus voltage levels VH, VL are generated.

Accordingly, when internal core signals OUT1, OUT2 are not asserted, pad control logic 102, 112 in either the processor 101 or memory controller 110 asserts pull-up logic enable signals PUEN1, PUEN2 that respectively turn on pull-up logic 103, 113 in both devices 101, 110, where the pull-up logic 103, 113 is also dynamically controlled to exhibit a termination impedance that provides for proper transmission of signals over the bus 120. In addition, the pad control logic 102, 112 also deasserts pull-down logic enable signals PDEN1, PDEN2, thus turning off respective pull-down logic 105, 115 in both devices 101, 110.

When core signal OUT1 is asserted, the pad control logic 102 in the processor 101 deasserts PUEN1, turning off the pull-up logic 103, and asserts PDEN1, turning on the pull-down logic 105, where the pull-down logic is dynamically controlled to exhibit an impedance when driving node PAD1 104 that comports with the characteristic impedance $Z_0$ such a proper bus voltage level VL is achieved. Likewise, when core signal OUT2 is asserted, the pad control logic 112 in the memory controller 110 deasserts PUEN1, turning off its pull-up logic 113, and asserts PDEN1, turning on its the pull-down logic 115, thus propagating a correct signal level into the transmission line environment of the signal trace 120 having characteristic impedance $Z_0$.

The conventional point-to-point bus architecture is indeed effective from a performance standpoint for many applications, however, in U.S. Pat. No. 7,358,758 the present inventors noted numerous other application areas that benefit from the employment of multiple processors, particularly when a memory controller (or substantially equivalent bus interface device) with corresponding interface capabilities is provided as part of a multi-processor system configuration. Accordingly, the patent disclosed an apparatus and method to enable multiple processors to interoperate over a bus that required active impedance control.

Referring to FIG. 2, a block diagram is presented featuring a multi-processor environment 200 that is enabled over a bus 220 over a bus like that of FIG. 1, and as is disclosed in U.S. Pat. No. 7,358,758. The block diagram shows a plurality of processors 201 with interconnected nodes 202 developing respective bus signals PAD1-PADN. Hereinafter, the signal designators PAD1-PADN will be used to also refer to a specific one of the nodes 202. The plurality of processors 201 are also interfaced to a memory controller 211 (or substantially similar device 211) with bus interface node 212 that develops a bus interface signal PADM, substantially similar to that shown in FIG. 1. In one embodiment, a variable number of processors 201 are enabled for inter-operation with the memory controller 211 over the bus 220. In a specific embodiment, up to four processors 201 are enabled for inter-operation. Each of the processors 201 and the memory controller 211 receive a prescribed termination impedance externally via resistors R1, R2 or like manners of indicating or specifying bus termination impedance, such as has been described previously herein. In one embodiment, R1 and R2 specify a 55 ohm termination impedance and a 27.5 ohm pull down impedance for a uniprocessor bus configuration. In addition, each of the processors 201 according to the present invention includes a node 204 for receiving a multi-processor signal MP that is employed to configure a multiprocessing environment. In one embodiment, the multi-processor node 204 comprises a pin 204 on a microprocessor package, where the pin is not otherwise employed in a system configuration according to the present invention. In this embodiment, signal MP is coupled to the multi-processor pin 204. Alternative embodiments are also contemplated for coupling the multi-processor node 204 to a signal MP to configure the multi-processing environment.

To control the termination impedance of the bus 220, the processor 201 that is physically at the end of the transmission line 220 opposite the memory controller 211 has its MP node 204 tied to a first reference signal MP whose value indicates that the processor 201 is at the end of the transmission line 220 opposite the memory controller 211. In the example shown in FIG. 2, PROCESSOR 1 201 is at the physical end of the bus 220 opposite the memory controller 211 and thus, its corresponding MP node 204 is coupled to the first reference signal MP. In one embodiment, as shown in the block diagram, the value of the first reference signal is ground, or common reference value (e.g., the VSS voltage). Other values of the first reference signal are contemplated as well. And to indicate that the processors 201 between PROCESSOR 1 201 and the memory controller 211 are internal to the bus 220, that is, PROCESSOR 2 201 through PROCESSOR N 201, their corresponding MP nodes 204 are tied to second reference signals whose values indicate that the processors 201 are internal to the bus 220. In one embodiment the value of the second reference signals is VDD. Alternative embodiments for the second reference voltage comprehends substantially similar reference voltages provided for I/O devices on the bus 220. Other embodiments for indicating the physical location of processors on the bus are contemplated as well, such as multiple-pin encoding, writing internal registers via a JTAG bus (not shown), programming of machine specific registers, etc.

Because PROCESSOR 1 201 is at the far end of the bus 220, it is configured (via tying node MP 204 to ground) to dynamically control the bus pull-up termination impedance and to drive its corresponding PAD1 node 202 in substantially the same manner as is described above with reference to the processor 101 of FIG. 1. Also, as described with reference to FIG. 1, the memory controller 211 controls the bus pull-up termination impedance at its end of the bus 220 and drives its corresponding bus node PADM 212 in like manner. PROCESSOR 2 201-PROCESSOR N 201 (i.e., internal processors 201), however, drive the bus 220 differently according to the present invention because they are physically between PROCESSOR 1 201 and the memory controller 211. According to the present invention, internal processors PROCESSOR 2 201-PROCESSOR N 201 are configured via their corresponding multi-processor nodes MP 204 to turn off their pull-up logic (not shown) at all times so that the prescribed termination impedance of the bus 220 is maintained by PROCESSOR 1 201 and the memory controller 211. In addition, when one of the internal processors PROCESSOR 2 201-PROCESSOR N 201 drives to its respective bus node 202 to a low voltage value, alternative pull-down logic (not shown) therein is employed to drive the node 202 to a proper low voltage level in view of having to drive into two signal traces, each of characteristic impedance $Z_O$, with an effective impedance seen by a corresponding driver of $Z_O/2$. Thus, the alternative pull-down logic must be strong enough to drive nodes PAD2-PADN 202 to the prescribed low voltage level when driving into the two signal traces as opposed to one signal path.

Now turning to FIG. 3, a block diagram 300 is presented showing multi-processor environment apparatus that is included in each of the processors PROCESSOR 1-PROCESSOR N 201 of FIG. 2, as is described in U.S. Pat. No. 7,358,758. The block diagram 300 depicts a processor 301 that is coupled to a bus 320, or transmission line 320, having a characteristic impedance of $Z_O$, as is described above. The microprocessor 301 includes pad control logic 304, first pull-down logic 307, and pull-up logic 305, including control signals OUT1, PUEN1, PDEN1, that operate as described above for like-named signals with reference to FIG. 1. The pad control logic 304, first pull-down logic 307, and pull-up logic 307 each comprise logic, circuits, devices, or microcode (i.e., micro instructions or native instructions), or a combination of logic, circuits, devices, or microcode, or equivalent elements that are employed to perform functions and operations as described herein. The elements employed to perform these functions and operations may be shared with other circuits, microcode, etc., that are employed to perform other functions within the processor 301. According to the scope of the present application, microcode is a term employed to refer to a plurality of micro instructions. A micro instruction (also referred to as a native instruction) is an instruction at the level that a unit executes. For example, micro instructions are directly executed by a reduced instruction set computer (RISC) microprocessor. For a complex instruction set computer (CISC) microprocessor such as an x86-compatible microprocessor, x86 instructions are translated into associated micro instructions, and the associated micro instructions are directly executed by a unit or units within the CISC microprocessor.

In addition, the apparatus includes multi-processor ("MP") logic 303 and second pull-down logic 308. A signal MP is coupled to the MP logic303 and to a multiprocessor node P 302. As noted above, the present invention contemplates a number of embodiments for establishing a signal MP on the reference node P 302, one of which is shown in the block diagram 300. The block diagram 300 depicts node P 302 as a pin 302 on the microprocessor 301 and the value of MP is established by coupling node P 302 to a first or second reference voltage (not shown) as is describe above with reference to FIG. 2. The MP logic 303 senses the state of node P 302 (and thus, the value of signal MP as shown in the diagram 300) to determine if it is at the far end of the bus 320 or if it is internal to the bus 320. If the processor 301 is at the far end, then the MP logic 303 asserts signals ENPD1 and ENPU, that enable operation of the pull-up logic 305 and the first pull-down logic 307, as described with reference to FIGS. 1 and 2. Signal ENPD2 is deasserted, thus disabling operation of the second pull-down logic 308. A pad node 306 developing signal PAD and the bus termination impedance are thus controlled via the pull-up logic 305 and the first pull-down logic 307 as is required over a uniprocessor point-to-point environment. This configuration at the far end of the transmission line 320 provides for the actively controlled termination impedance that precludes ringing, etc., over the bus 320. The second pull-down logic 308 comprises logic, circuits, devices, or microcode (i.e., micro instructions or native instructions), or a combination of logic, circuits, devices, or microcode, or equivalent elements that are employed to perform functions and operations as described herein. The elements employed to perform these functions and operations may be shared with other circuits, microcode, etc., that are employed to perform other functions within the processor 301.

For internal processors, signal ENPU is deasserted by the MP logic 303, signal ENPD2 is asserted, and signal (i.e., node) PAD 306 is thus controlled via the first and second pull-down logic 307-308, operating in parallel. The pull-up logic 305 is disabled by the state of signal PUEN1 in an internal configuration, as indicated by the value of signal MP on node P 302. In one embodiment, the first and second pull-down logic 307-308 are configured to pull PAD 306 to a specified low voltage level VL when driving into two signal traces ("paths"), each of characteristic impedance $Z_O$. For illustrative purposes, an additional signal trace on the bus 320 is shown with dotted line connection to node 306, which corresponds to an internal processor configuration. In an alternative embodiment, the second pull-down logic 308 exhibits a strength that is different from that of the first pull-down logic 307, and the two pull-down logics 307-308 operate in parallel to achieve optimum pull down of PAD to the proper low voltage level VL.

Notwithstanding the advantages afforded by the configurations described with reference to FIGS. 2-3, the present inventors have observed that with the advent of so-called multi-core architectures, it is desirable to address the need for active termination impedance control for configurations having a plurality of processor cores that are coupled together over a bus to a memory controller or other device, where the processor cores are each configured as a single processor die, and where two or more of these single processor dies are disposed on a single substrate within a multi-core processor package that is coupled to the bus. To address this need, the present invention will now be discussed with reference to FIGS. 4-8.

Figure 4:
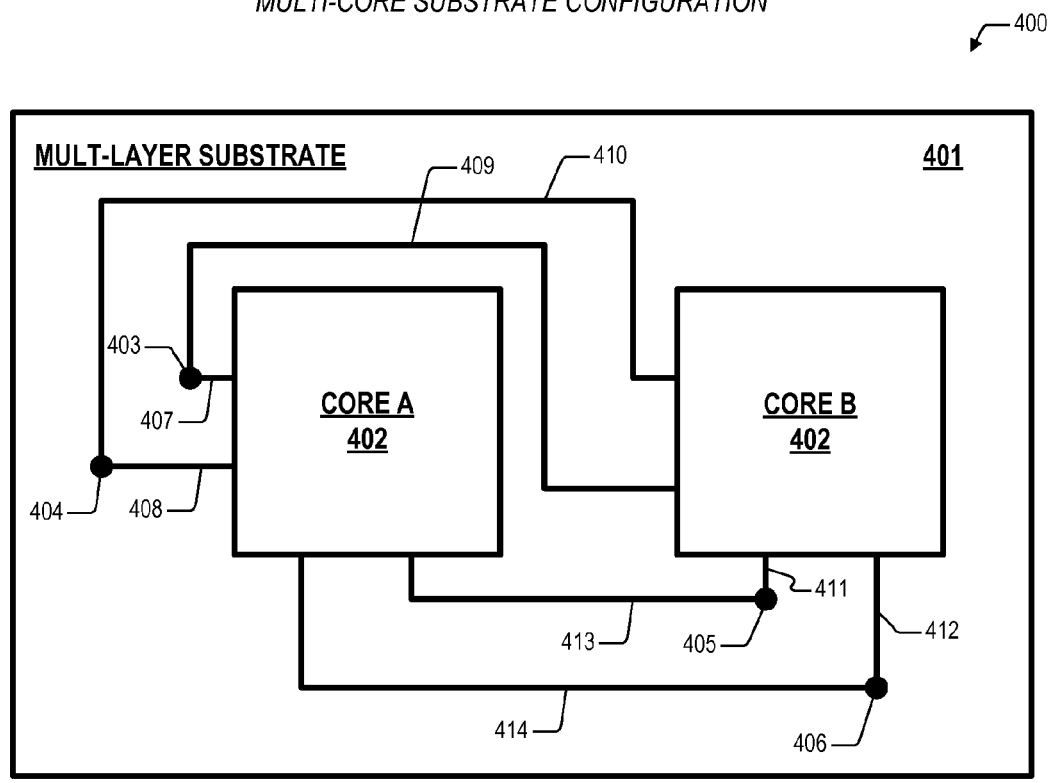
FIG. 4 is a block diagram showing an exemplary multi-core processor disposed on a single substrate.

Turning to FIG. 4, a block diagram is presented showing an exemplary multi-core processor 400 disposed on a single substrate 401. The multi-core processor 400 includes two processor cores 402, CORE A and CORE B, each of which is disposed on the substrate 401. The substrate 401 may, in one embodiment, be configured as a ball grid array forming part of an overall package for the multi-core processor 400, which is mounted to a motherboard (not shown) or system board (not shown) as part of a system configuration. Other embodiments for coupling the multi-core processor 400 to a system configuration are contemplated as well.

The substrate 401 typically has multiple layers due to the fact that a present day processor core 402 comprises hundreds of connection points (or "pins") which must be routed to matching signals on the motherboard or to other processor dies mounted to the substrate 401. These pins are generally on the face of the substrate opposite to the face upon which the processor cores 402 are mounted. Similarly, the layers of the substrate 401 include hundreds of interconnecting traces 407-414 that are provided to route particular signals to specific pins on each of the processor cores 402 and include hundreds of vias 403-406 which provide for interconnection of traces 408-414 between layers of the substrate 401.

For purposes of teaching the present invention, the multi-core processor 400 is shown to include only two processor cores 402 which share four signals that are coupled to the four vias 403-406, however, as one skilled in the art will appreciate, present day multi-core architectures can include up to eight processor cores 402 disposed on a substrate 401, with future predications leading to up to 16 processor cores 402.

Additional numbers of cores 402 are comprehended by the present invention as well. For clarity, the traces 407-414 and vias 403-406 are depicted on a top layer of the substrate 401 and outside of the physical boundaries of each of the processor cores 402, however, one skilled in the art will also appreciate that it is normal to configure traces 407-414 on internal layers of the substrate 401.

At via 403, a first signal is routed over trace 407 to a first pin on CORE A 402, and the same first signal is routed over trace 409 to a corresponding first pin on CORE B 402. At via 404, a second signal is routed over trace 408 to a second pin on CORE A 402, and the same second signal is routed over trace 410 to a corresponding second pin on CORE B 402. From a transmission line standpoint then, with respect to the first and second signals CORE B 402 is at the end of the transmission line and CORE A 402 is internal to the transmission line, for traces 409 and 410 are physically longer than traces 407 and 408.

On the other hand, at via 405, a third signal is routed over trace 411 to a third pin on CORE B 402, and the same third signal is routed over trace 413 to a corresponding third pin on CORE A 402. At via 406, a fourth signal is routed over trace 412 to a fourth pin on CORE B 402, and the same fourth signal is routed over trace 414 to a corresponding fourth pin on CORE B 402. And from a transmission line standpoint, with respect to the third and fourth signals CORE A 402 is at the end of the transmission line and CORE B 402 is internal to the transmission line, for traces 413 and 414 are physically longer than traces 411 and 412.

Consequently, the present inventors have noted that interfacing a multi-core processor 400 to a system bus is problematic in that the physical mounting point of each of the cores 402 cannot be employed as an indication of whether they are internal to the bus or at the end of the bus. From the example of FIG. 4, it is clear that transmission line topology must be determined on a signal-by-signal basis. That is, for every signal in a multi-core processor configuration that is bussed, the transmission line location (i.e., internal or at the end) is a function of the physical length of the traces 407-414 that route the signals through the substrate 401 to each of the processor cores 402. Such a topology is exacerbated when additional cores 402 are added to the substrate 401, however, one skilled in the art will appreciate that for each signal that is coupled, one of the cores 402 can be designated as the end of the transmission line because the sum of the physical lengths of the trace 407-414 that couple that signal from the motherboard connection point to the core 402 at the end of the transmission line is longer that the sum of the lengths of the traces coupling that signal from the motherboard connection point to any of the remaining cores 402

Thus, the present invention is provided to address how driver circuitry within each of the cores 402 is to function in order to comport with requirements of bus protocol while at the same time providing for minimization of transmission line effects as described above. Embodiments of the present invention will now be presented with reference to FIGS. 5-8 which address, respectively, 1) a location-based technique for performing active bus termination for a single multi-core processor 400 coupled to a bus, 2) a location-based technique for performing active bus termination for two or more multi-core processors 400 coupled to a bus, 3) a protocol-based technique for performing active bus termination for one or more multi-core processors 400 coupled to a bus, and 4) a configurable active bus termination technique for one or more multi-core processors 400 coupled to a bus.

Figure 5:
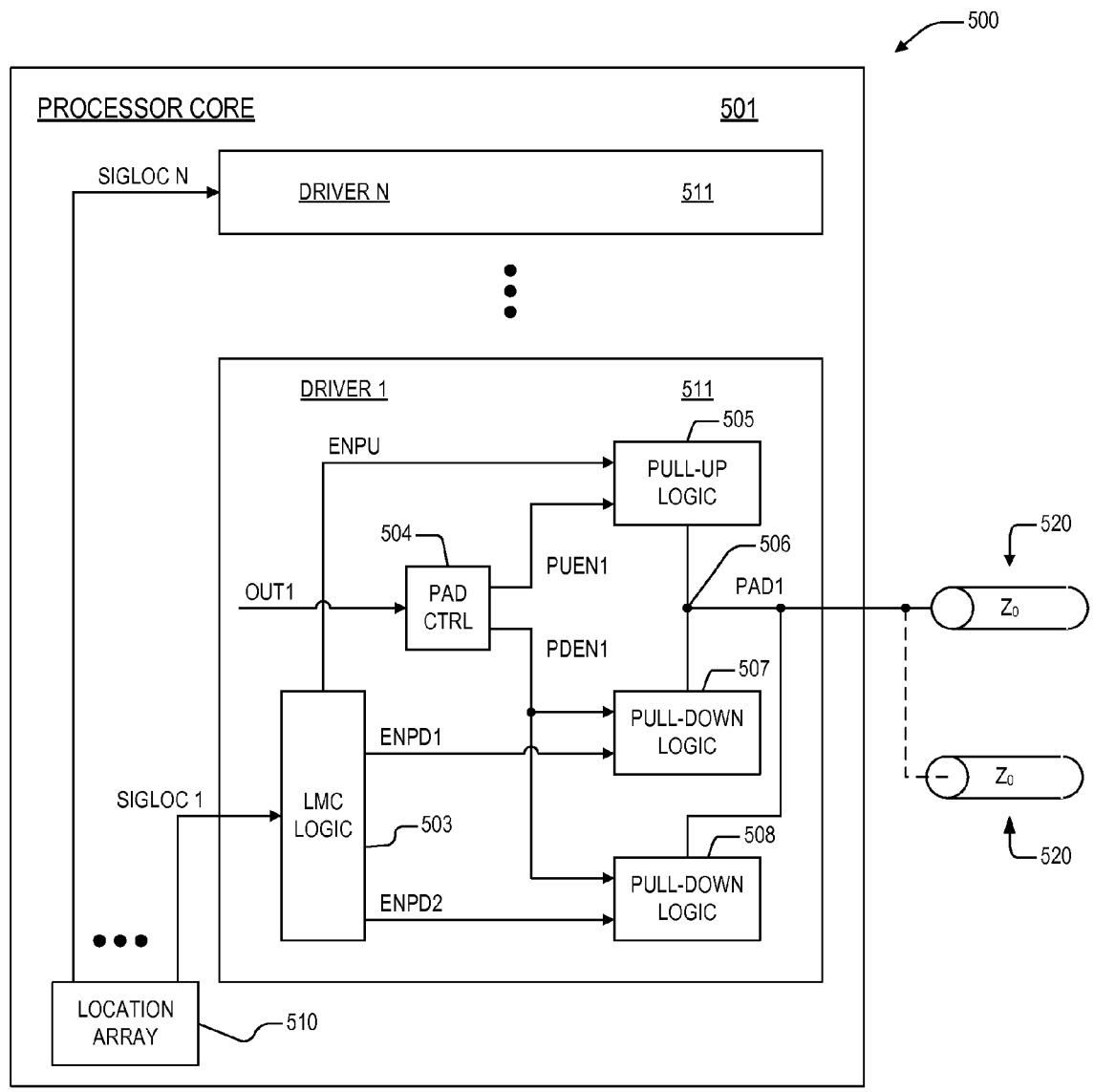
FIG. 5 is a block diagram illustrating a location-based multi-core bus termination apparatus according to the present invention.

Referring to FIG. 5, a block diagram 500 is presented illustrating a location-based multi-core bus termination apparatus according to the present invention. The apparatus may be employed when a single multi-core processor (not shown), such as the multi-core processor 400 of FIG. 4, is coupled to a plurality of bussed signals disposed on a motherboard or like device. The block diagram 500 depicts one of the processor cores 501 that is coupled to a substrate (not shown) for the multi-core processor. The processor core 501, in one embodiment, is an x86-compatible microprocessor core, although other processor architectures are contemplated. The core 501 includes a plurality of substantially identical drivers 511, denoted as DRIVER 1-DRIVER N. In addition, the core 501 has a location array 510 developing a corresponding plurality of location signals SIGLOC 1-SIGLOC N, each of which is coupled to a corresponding one of the drivers 511. The location array 510 comprises logic, circuits, devices, or microcode (i.e., micro instructions or native instructions), or a combination of logic, circuits, devices, or microcode, or equivalent elements that are employed to perform functions and operations as described herein. The elements employed to perform these functions and operations may be shared with other circuits, microcode, etc., that are employed to perform other functions within the processor core 501.

The block diagram 500 depicts one of the drivers 511 DRIVER 1 developing a bidirectional signal PAD1 that is coupled to a bus 520, or transmission line 520, having a characteristic impedance of $Z_0$, as is described above. Although not shown in FIG. 5, it is noted that each of the drivers 511 develop respective bidirectional signals, each of which is coupled to a respective bus. For purposes of this disclosure, a bus may comprise a group or groups of signals, one of which is exemplified by signal PAD1, where the group or groups are transmitted together or in some known sequential order according to a specified protocol. For instance, a 64-bit data bus, a 32-bit address bus, and a corresponding control bus, are quite common to present day processing system configurations, and although the protocols for synchronizing transmission of data/address/control information over these busses differ according to processor architecture, these protocols are well known and understood by those skilled in the art.

Yet, as was noted above in the discussion with reference to FIG. 4, whether a particular signal (e.g., PAD1) is internal to the bus or at the end of the bus is determined based upon the total trace length that couples each of the particular signal from a motherboard connection point through a substrate and to the processor core 501. Thus, signal PAD 1 may be designated as an internal bus signal while another signal (not shown) developed by one of the other drivers 511 may be designated as being at the end of the bus. In fact, it is entirely expected that normally grouped signals such as those within, say, a 64-bit data bus would not have the same core 501 designated as the bus endpoint. That is, each of the signals within the group would have a corresponding processor core 501 that is the designated end of the transmission line based upon routing of the signals over the substrate.

Each of the drivers 511 are substantially identical with respect to the present invention, thus DRIVER 1 511 will be described in detail below. DRIVER 1 includes pad control logic 504, first pull-down logic 507, second pull-down logic 508, and pull-up logic 505, including control signals OUT1, PUEN1, PDEN1 that operate as described above for like-named elements as are described above with reference to FIG. 3. The pad control logic 504, first pull-down logic 507, second pull-down logic 508, and pull-up logic 507 each comprise logic, circuits, devices, or microcode (i.e., micro instructions or native instructions), or a combination of logic, circuits, devices, or microcode, or equivalent elements that are employed to perform functions and operations as described herein. The elements employed to perform these functions and operations may be shared with other circuits, microcode, etc., that are employed to perform other functions within the processor core 501.

In contrast to FIG. 3, driver 511 includes location-based multi-core ("LMC") logic 503. A corresponding location signal SIGLOC 1 is coupled to the LMC logic 503 and to the location array 510. In one embodiment, the location array 510 comprises a programmable fuse array 510 that is disposed within the core 501 and which is programmed during fabrication of the processor core 501 by any of several well-known techniques. In another embodiment, the location array 510 comprises a machine specific register that is programmable via the execution of special instructions (i.e., microcode) during reset of the core 501.

The value of signal SIGLOC 1 indicates whether signal PAD1 is at the end of the bus or internal to the bus. In one embodiment, if SIGLOC 1 is asserted, then it is indicated that PAD1 is at the end of the bus. The LMC logic 503 senses the state of SIGLOC 1 to determine if PAD1 is at the far end of the bus 520 or if it is internal to the bus 520. If PAD1 is at the far end, then the LMC logic 503 asserts signals ENPD1 and ENPU, that enable operation of the pull-up logic 305 and the first pull-down logic 507, as described with reference to FIGS. 1 and 2. Signal ENPD2 is deasserted, thus disabling operation of the second pull-down logic 508. A pad node 506 developing signal PAD1 and the bus termination impedance are thus controlled via the pull-up logic 505 and the first pull-down logic 507 as is required by bus protocol. This configuration at the far end of the transmission line 520 provides for the actively controlled termination impedance that precludes high frequency noise, ringing, etc., over the bus 520.

For internal processors, signal ENPU is deasserted by the LMC logic 503, signal ENPD2 is asserted, and signal PAD 1 is thus controlled via the first and second pull-down logic 507-508, operating in parallel. The pull-up logic 505 is disabled by the state of signal PUEN1 in an internal configuration, as indicated by the value of signal SIGLOC 1. In one embodiment, the first and second pull-down logic 507-508 are configured to pull PAD 506 to a specified low voltage level VL when driving into two signal traces ("paths"), each of characteristic impedance $Z_0$. For illustrative purposes, an additional signal trace on the bus 520 is shown with dotted line connection to node 306, which corresponds to an internal processor configuration. In an alternative embodiment, the second pull-down logic 508 exhibits a strength that is different from that of the first pull-down logic 507, and the two pull-down logics 507-508 operate in parallel to achieve optimum pull down of PAD 1 to the proper low voltage level VL.

The embodiment discussed with reference to FIG. 5 is sufficient to provide for minimization of transmission line effects corresponding to a single multi-core processor configuration. For configurations that consist of two or more multi-core processors, the embodiment of FIG. 6 is provided.

Figure 6:
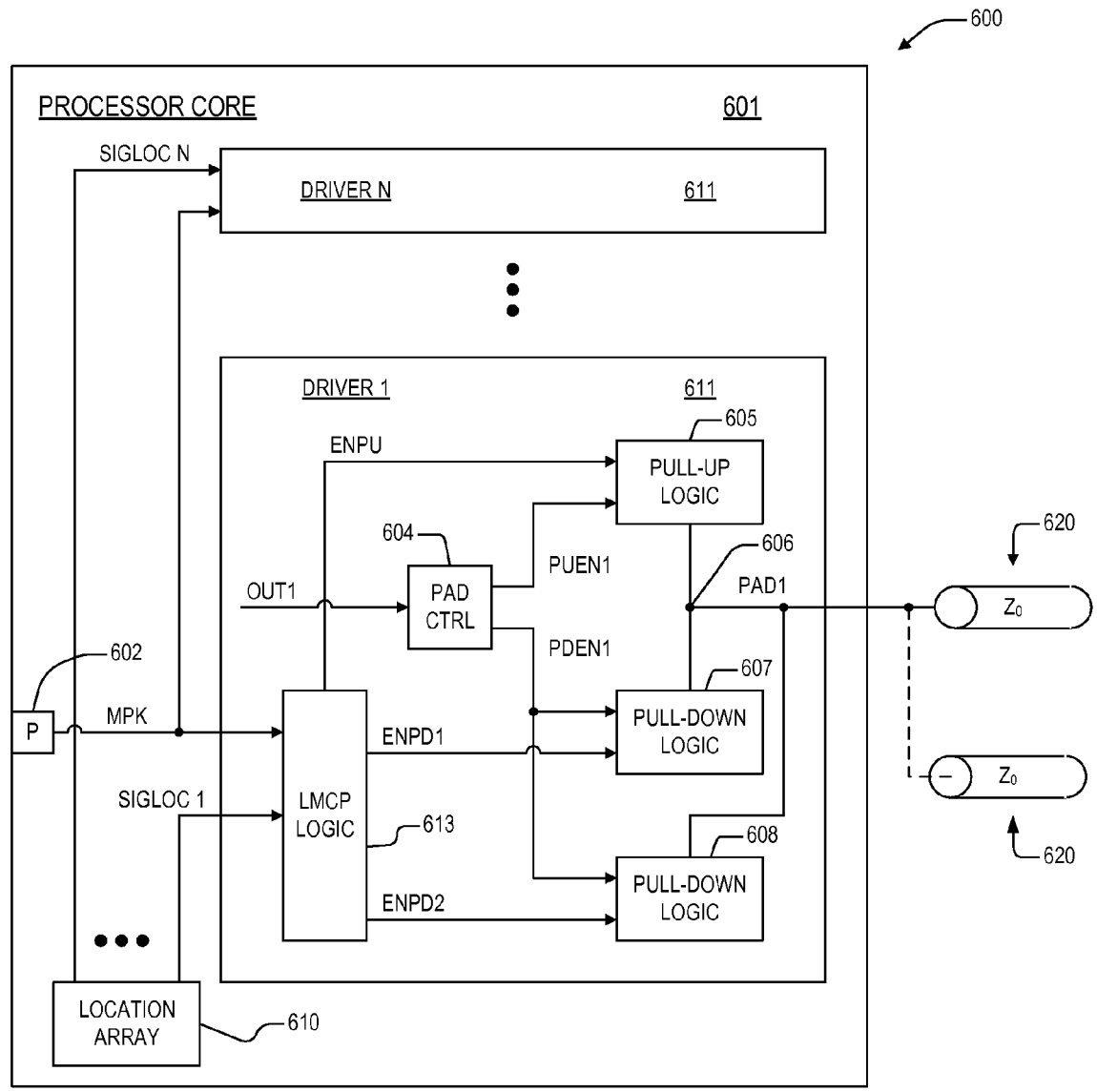
FIG. 6 is a block diagram depicting a location-based multi-core/multi-package bus termination apparatus according to the present invention.

FIG. 6 is a block diagram 600 is presented depicting a location-based multi-core/multi-package bus termination apparatus according to the present invention. The apparatus may be employed when two or more multi-core processors (not shown), such as the multi-core processor 400 of FIG. 4, are coupled to a plurality of bussed signals disposed on a motherboard (not shown) or like device in a configuration like that shown in FIG. 2. The block diagram 600 depicts one of the processor cores 601 that is coupled to a substrate (not shown) for the multi-core processor. The elements of core 601 are substantially the same and operate in substantially the same manner as those like numbered elements of FIG. 5, where a "6" is substituted for the hundreds digit. To provide for proper bus terminations corresponding to two or more multi-core processors, location-based multi-package logic 613 is provided in place of the LMC logic 503 of FIG. 5. In addition, the processor core 601 includes a signal MPK that is coupled to the LMCP logic 613 and to a multi-package node P 602. As noted earlier, the present invention contemplates a number of embodiments for establishing signal MPK on the reference node P 602, one of which is shown in the block diagram 600. The block diagram 600 depicts node P 602 as a pin 302 on the processor core 601 and the value of MPK is established by coupling node P 602 to a first or second reference voltage (not shown) as is described above with reference to FIG. 2. The LMCP logic 613 senses the state of node P 602 (and thus, the value of signal MPK as shown in the diagram 600) to determine if a package (i.e., the substrate) upon which the processor core 601 is disposed is at the far end of the bus 620 or if it is internal to the bus 620. In addition, like the LMC logic 503 of FIG. 5, the LMCP logic 613 senses the value of signal SIGLOC 1 to determine if PAD1 is at the far end of the bus 620, as described above with reference to FIG. 5, or if it is internal to the bus 620.

The values of signals SIGLOC 1-SIGLOC N generated by the location array 610 according to the embodiment of FIG. 6 may indicate that a corresponding signal output signal (e.g., PAD1) is at the end of the bus 620, but this indication is only as is known from the perspective of the particular substrate upon which the location array 610 is disposed. Consequently, if the state of MPK indicates that the package upon which the processor core 601 is disposed is at the far end of the bus 620, then operation of each of the drivers 611 within the core 601 is identical to the embodiment discussed with reference to FIG. 5.

If, however, the state of MPK indicates that the package upon which the processor core 601 is disposed is internal to the bus 620, then signal ENPU is deasserted by the LMCP logic 613, signal ENPD2 is asserted, and signal PAD 1 is thus controlled via the first and second pull-down logic 607-608, operating in parallel. The pull-up logic 605 is disabled by the state of signal PUEN1 in an internal package configuration, as indicated by the value of signal MPK on node P 602.

To summarize, if the states of MPK and SIGLOC 1 both indicate that a corresponding signal PAD1 is at the end of the bus 620, then the LMCP logic 613 enables the pull-up logic 605 when the bus 620 is not being driven (i.e., the state of PAD1 is at the high voltage level VH). When the bus 620 is being driven to assert a low voltage level VL, then the LMCP logic 613 turns off the pull-up logic 605, and drives PAD1 using only first pull-down logic 607. On the other hand, if the state of MPK indicate that PAD 1 is internal to bus 620, then the LMCP logic 613 disables the pull-up logic 605 when the bus 620 is not being driven. And when the bus 620 is being driven to assert a low voltage level VL, then the LMCP logic 613 keeps the pull-up logic 605 turned off, and drives PAD1 using both the first pull-down logic 607 and the second pull-down logic 608.

The embodiments discussed with reference to FIGS. 5-6 employ a technique whereby the physical location in terms of trace length (FIG. 5), or trace length and motherboard position (FIG. 6), are used to designate a signal and its corresponding driver as being at the end of the bus or internal to the bus. This is because proper bus termination must be provided at both ends of the bus, that is, the end upon which the chipset is disposed and the end upon which the multi-core substrate farthest from the chipset is disposed. Proper termination is necessary at the chipset end of the bus to provide for signals that are driven by a processor core (i.e., writes). Proper termination is required at the processor end of the bus to provide for signals that are driven by the chipset (i.e., reads). A driver that is designated as being at the end of the bus must keep its pull-up logic enabled when not driving the bus (to provide for bus reads) and a driver that is internal to the bus must keep its pull-up logic disabled when not driving the bus. During bus writes, both internal and external drivers must turn off their respective pull-up logic when driving low for the termination impedance is generated at the other end of the bus by the chipset. Far end drivers employ only first pull-down logic to drive low and internal drivers employ both first and second pull-down logic.

The present inventors have also observed that for many signals and signal groups such as address, data, and control busses, as is noted above, specific bus protocols provide rules and corresponding protocol signals that are employed to determine exclusive access (or "ownership") of a given bus by a given processor core. That is, based upon a knowledge of previous events that have occurred on a given bus along with the current states of certain ones of the protocol signals, all of the processor cores coupled to the bus can determine which one of the processor cores has exclusive ownership of the bus. It is beyond the scope of the present application to provide a detailed discussion of particular bus protocols, however, one skilled in the art will appreciate that virtually all present day system busses provide a protocol that specifies rules and corresponding protocol signals by which a given processor core can determine whether or not it "owns" the bus for purposes of reading or writing data that is associated with one or more groups of signals. Hence, to provide for active termination control in a multi-core/multi-package configuration having groups of signals that are ruled according to one or more bus protocols by which exclusive ownership of the bus can be determined, an embodiment of the present invention will now be discussed with reference to FIG. 7.

Figure 7:
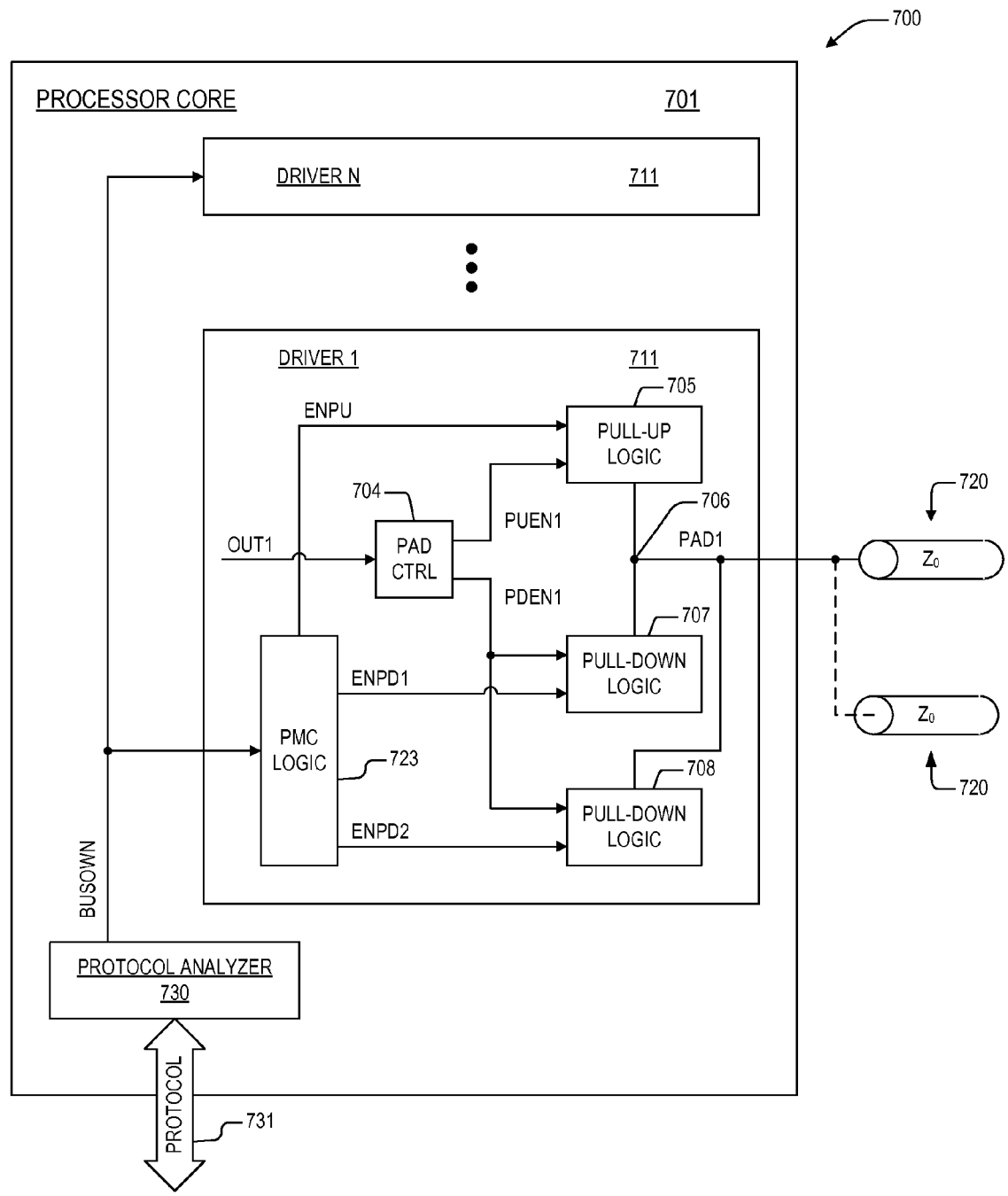
FIG. 7 is a block diagram featuring a protocol-based multi-core bus termination apparatus according to the present invention which may be employed in a configuration having one or more multi-core packages coupled to a bus.

FIG. 7 is a block diagram 700 featuring a protocol-based multi-core bus termination apparatus according to the present invention which may be employed in a configuration having one or more multi-core packages coupled to a bus. The apparatus may be employed when two or more multi-core processors (not shown), such as the multi-core processor 400 of FIG. 4, are coupled to a plurality of protocol-based bussed signals disposed on a motherboard (not shown) or like device in a configuration like that shown in FIG. 2. For purposes of the present application, the term "protocol-based bussed signals" is employed to mean one or more groups of signals that are ruled according to one or more bus protocols by which exclusive ownership of the bus can be determined.

The block diagram 700 depicts one of the processor cores 701 that is coupled to a substrate (not shown) for the multi-core processor. The elements of core 701 are substantially the same and operate in substantially the same manner as those like numbered elements of FIG. 6, where a "7" is substituted for the hundreds digit. To provide for proper bus terminations as can be determined by knowledge of previous events that have occurred on a given bus along with the current states of protocol signals 731, protocol-based multi-core logic ("PMC") 723 is provided in place of the LMCP logic 613 of FIG. 6.

The block diagram 700 also shows a protocol analyzer 730 that is coupled to one or more protocol signals PROTOCOL 731. The protocol analyzer 730 develops a signal BUSOWN whose state indicates whether or not the processor core 701 owns the protocol-based bus for purposes of transferring information. Signal BUSOWN is coupled to each of a plurality of substantially identical drivers 711 that develop signals within a signal group which are governed by the one or more bus protocols.

In operation, the protocol analyzer 730 determines ownership of the protocol-based bus based upon knowledge of previous events that have occurred on the protocol-based bus along with the current states of the protocol signals 731. If the core 701 owns the protocol-based bus, then the protocol analyzer 730 asserts BUSOWN. If the core 701 does not own the protocol-based bus, then the protocol analyzer 730 does not assert BUSOWN.

It is noted that since ownership of the protocol-based bus is exclusive, only one processor core 701 in a multi-core/multi-package configuration will have signal BUSOWN asserted. All the remaining cores 701 will not assert their corresponding BUSOWN signals.

Accordingly, the PMC logic 723 in each senses the state of signal BUSOWN to determine whether or not the processor core 701 owns the protocol-based bus. If the core 701 does not own the protocol-based bus, then the PMC logic 723 deasserts signal ENPU, thus turning off the pull-up logic 705. If the core 701 owns the protocol-based bus, then the PMC logic 723 asserts signal ENPU, thus turning on the pull-up logic 705. Hence, pull-up logic 705 is turned on in all of the drivers 711 for only one of the cores 701 that are coupled to a protocol-based bus at any given point in time; the remaining cores 701 on the protocol-based bus have pull-up logic 705 that is turned off.

As a result, the "end of the bus" for a group or groups of signals, as is exemplified by signal PAD1, is dynamically determined and controlled. And since all other cores 701 have their pull-up logic 705 turned off, the topology of the protocol-based bus at any point in time is a point-to-point topology. That is, there is only one core 701 that provides active termination control; all the other cores 701—though coupled to the protocol-based bus—do not provide any active termination control features. The "end of the bus" always moves to the core 701 that owns the bus at a particular point in time and as a result there are no "internal" bus devices.

The protocol analyzer 730 and PMC logic 723 each comprise logic, circuits, devices, or microcode (i.e., micro instructions or native instructions), or a combination of logic, circuits, devices, or microcode, or equivalent elements that are employed to perform functions and operations as described herein. The elements employed to perform these functions and operations may be shared with other circuits, microcode, etc., that are employed to perform other functions within the processor core 701.

If the state of BUSOWN is not asserted, then the PMC logic 723 turns off the pull-up logic 705. Since the core 701 does not own the protocol-based bus, it will not be driving signal PAD1 nor will it be directly communicating with the chipset.

If the state of BUSOWN is asserted, then the PMC logic 723 turns on the pull-up logic 705 when the bus 720 is not being driven (i.e., the state of PAD1 is at the high voltage level VH). When the bus 720 is being driven to assert a low voltage level VL, then the PMC logic 723 turns off the pull-up logic 705, and drives PAD1 using only first pull-down logic 607.

An alternative embodiment contemplates a driver 711 having only first pull-down logic 707, since second pull-down logic 708 is never employed when protocol-based termination is practiced.

The present inventors realized that there are many applications where system configurations are provided that require the use of both protocol-based busses and bussed signals that are not governed by protocol. To address these types of configurations, an embodiment of the present invention will now be discussed with reference to FIG. 8.

Figure 8:
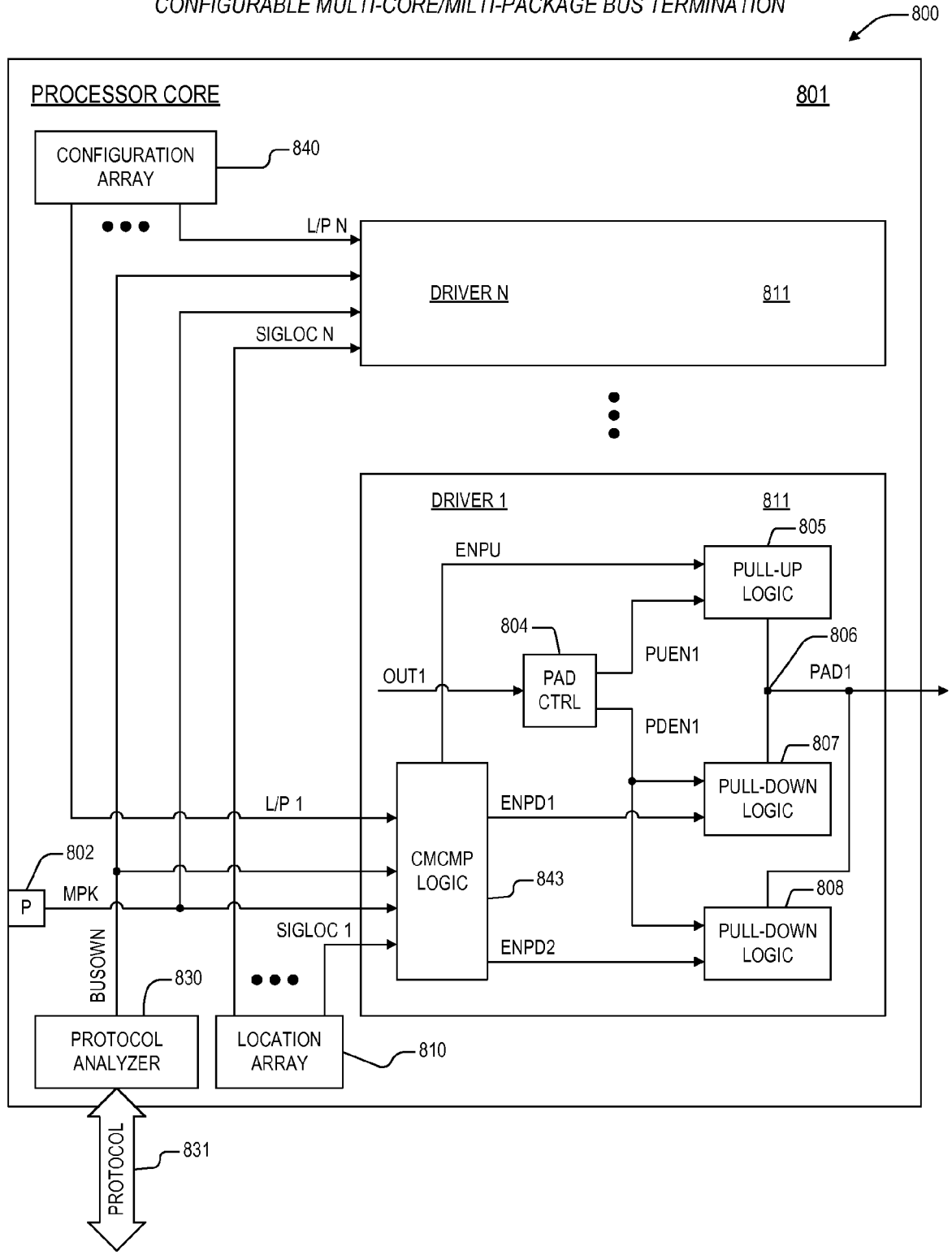
FIG. 8 is a block diagram showing a configurable multi-core bus termination mechanism according to the present invention.

FIG. 8 is a block diagram 800 showing a configurable multi-core bus termination mechanism according to the present invention. The apparatus may be employed when one or more multi-core processors (not shown), such as the multi-core processor 400 of FIG. 4, are coupled to one or more protocol-based bussed signals and one or more location-based bussed signals disposed on a motherboard (not shown) or like device in a configuration like that shown in FIG. 2. For purposes of the present application, the term "location-based bussed signals" is employed to mean one or more signals that are not ruled according to one or more bus protocols by which exclusive ownership of the bus can be determined. That is, location-based bussed signals fall into the category of those bussed signals which are discussed above with reference to FIGS. 4-6. For example, control signals that couple a microprocessor to/from a voltage regulator module (VRM) may be considered as one example of a set of location-based bussed signals.

The block diagram 800 depicts one of the processor cores 801 that is coupled to a substrate (not shown) for the multi-core processor. The elements of core 801 are substantially the same and operate in substantially the same manner as those like numbered elements of FIG. 7, where an "8" is substituted for the hundreds digit. In addition, the core 801 includes a location array 810 developing location signals SIGLOC 1-SIGLOC N, and which are substantially the same in embodiment and operation as the location array 510 of FIG. 5. The processor core 801 also includes a signal MPK that is coupled to a multi-package node P 802, both of which are substantially the same in embodiment and operation as signal MPK and node P 602 of FIG. 6. Furthermore, the core 801 includes a protocol analyzer 830 coupled to a protocol control bus 831 and developing a bus ownership signal BUSOWN, all of which are substantially the same in embodiment and operation as the like-named elements of FIG. 7.

The core 801 has a driver configuration array 840 developing a corresponding plurality of location/protocol signals L/P 1-L/P N, each of which is coupled to a corresponding one of the drivers 811. Each of the drivers 811 include configurable multi-core/multi-package ("CMCMP") logic 843, to which is coupled a corresponding location signal SIGLOC 1-SIGLOC N, signal MPK, and signal BUSOWN. The driver configuration array 840 and CMCMP logic 833 comprise logic, circuits, devices, or microcode (i.e., micro instructions or native instructions), or a combination of logic, circuits, devices, or microcode, or equivalent elements that are employed to perform functions and operations as described herein. The elements employed to perform these functions and operations may be shared with other circuits, microcode, etc., that are employed to perform other functions within the processor core 801.

A corresponding location/protocol signal L/P 1 is coupled to the CMCMP logic 843 and to the configuration array 840. In one embodiment, the configuration array 840 comprises a programmable fuse array 840 that is disposed within the core 801 and which is programmed during fabrication of the processor core 801 by any of several well-known techniques. In another embodiment, the configuration array 840 comprises a machine specific register that is programmable via the execution of special instructions (i.e., microcode) during reset of the core 801.

The value of signal L/P 1 indicates whether its corresponding driver DRIVER 1 811 is to employ location-based bus termination or protocol-based bus termination, the two techniques having been described above with reference to FIGS. 5-7. If the state of L/P 1 indicates that location-based termination is to be employed, then the CMCMP logic 843 controls the pull-up logic 805, first pull-down logic 807, and second pull-down logic 808 as is described above with reference to FIGS. 5-6. That is, bus location (i.e., end or internal) is determined by the states of signals MPK (for multi-package configurations) and SIGLOC 1. If the state of L/P 1 indicates that protocol-based termination is to be employed, then the CMCMP logic 843 controls the pull-up logic 805, first pull-down logic 807, and second pull-down logic 808 as is described above with reference to FIG. 8. That is, termination for a given output PAD1 is based upon whether or not the core 801 owns the bus, as is indicated by signal BUSOWN.

As noted herein, the mechanism according to the present invention provides the advantageous characteristics of an actively terminated bus while also providing an environment for multiple cores within a package, multiple multi-core package configurations, and options to provide for termination based on location and/or protocol.

Although the present invention and its objects, features, and advantages have been described in detail, other embodiments are encompassed by the invention as well. For example, the present invention has been presented in terms related to a processor and memory controller (or substantially similar device). It is noted, however, that such examples are used to teach the present invention in a context that is familiar to many of those in the art. But the present inventors note that bus protocols and transmission line interface requirements are not specific or unique to the processor arts and as such, the present invention lends itself to application in any area where a bus interface having active impedance control requirements is specified.

In addition, the present invention has been described herein with reference to first and second pull-down logic, which operate in an internal processor in parallel to pull-down a bus that is actively terminated at both ends by other devices, the scope of the present invention is not restricted to two sets of pull-down logic equally configured. An alternative embodiment also contemplates a configuration where a second pull-down logic is employed exclusive of a first pull-down logic to pull down a bus voltage from a device that is internal to the bus. In one embodiment, the second pull-down logic is configured to pull down the bus voltage to a proper voltage level exclusive of any other device.

Those skilled in the art should appreciate that they can readily use the disclosed conception and specific embodiments as a basis for designing or modifying other structures for carrying out the same purposes of the present invention, and that various changes, substitutions and alterations can be made herein without departing from the scope of the invention as defined by the appended claims.

What is claimed is:

1. An apparatus for enabling a multi-core/multi-package environment on a bus, the bus requiring active termination impedance control, the apparatus comprising:
   a first node, disposed within a processor core and configured to receive an external multi-package signal indicating whether a package upon which said processor core is disposed is internal to the bus or at a far end of the bus;
   a location array, disposed within said processor core and configured to generate a plurality of location signals that indicate locations on the bus of a corresponding plurality of nodes that are coupled to the bus, wherein said locations comprise either an internal location or a bus end location; and
   a plurality of drivers, coupled to said plurality of location signals, each comprising one of said corresponding plurality of nodes, and each configured to control how said one of said corresponding plurality of nodes is driven responsive to a first state of a corresponding one of said plurality of location signals and a second state of said first node, each of said plurality of drivers comprising:
  location-based multi-core/multi-package logic, configured to enable pull-up logic and first pull-down logic if said first state indicates said bus end location and said second state indicates that said package is at said far end, and configured to disable said pull-up logic and enable said first pull-down logic and second pull-down logic if said first state indicates said internal location and said second state indicates that said package is at said far end, and configured to disable said pull-up logic and enable said first pull-down logic and said second pull-down logic if said second state indicates that said package is internal to the bus.

2. The apparatus as recited in claim 1, wherein, if said first state indicates said bus end location and said second state indicates that said package is at said far end, said first pull-down logic drives said one of said corresponding plurality of nodes to a prescribed low voltage level regardless of whether said pull-up logic is enabled or disabled.

3. The apparatus as recited in claim 1, wherein, if said second state indicates that said package is internal to the bus, said first and second pull-down logics drive said one of said corresponding plurality of nodes to a prescribed low voltage level.

4. The apparatus as recited in claim 1, wherein said location-based multi-core/multi-package logic comprises a plurality of fuses disposed on one or more layers of a die corresponding to said processor core.

5. The apparatus as recited in clam 4, wherein said plurality of fuses is programmed during fabrication of said processor core.

6. The apparatus as recited in claim 1, wherein said location-based multi-core/multi-package logic comprises a machine specific register, and wherein contents of said machine specific register are programmed via execution of instructions during reset of said processor core.

7. The apparatus as recited in claim 1, wherein said processor core is coupled to a substrate in a multi-core processor configuration.

8. The apparatus as recited in claim 7, wherein said multi-core processor is coupled to a chipset via the bus and to one or more other multi-core processors via the bus.

9. The apparatus as recited in claim 1, wherein said pull-up logic, when enabled, generates a termination impedance as specified for the bus, and wherein said termination impedance is generated to match a characteristic impedance of the bus.

10. An apparatus providing for a multi-core/multi-package environment on a bus, where the bus requires active termination impedance control, the apparatus comprising:
  a first node, disposed within a processor core and configured to receive an external multi-package signal indicating whether a package upon which said processor core is disposed is internal to the bus or at a far end of the bus;
  location-based multi-core/multi-package logic, disposed within a driver, and configured to enable pull-up logic and first pull-down logic if a first state of one of a plurality of location signals indicates that a corresponding one of a plurality of nodes is at a bus end location and a second state of said first node indicates that said package is at said far end, and configured to disable said pull-up logic and enable said first pull-down logic and second pull-down logic if said first state indicates said internal location and said second state indicates that said package is at said far end, and configured to disable said pull-up logic and enable said first pull-down logic and second pull-down logic if said second state indicates that said package is internal to the bus; and
  a location array, disposed within said processor core and coupled to said location-based multi-core/multi-package logic, and configured to generate said plurality of location signals that indicate locations on the bus of said plurality of nodes, wherein said locations comprise either said internal location or said bus end location.

11. The apparatus as recited in claim 10, wherein, if said first state indicates said bus end location and said second state indicates that said package is at said far end, said first pull-down logic drives said corresponding one of a plurality of nodes to a prescribed low voltage level regardless of whether said pull-up logic is enabled or disabled.

12. The apparatus as recited in claim 10, wherein, if said second state indicates that said package is internal to the bus, said first and second pull-down logics drive said corresponding one of said plurality of nodes to a prescribed low voltage level.

13. The apparatus as recited in claim 10, wherein said location-based multi-core/multi-package logic comprises a plurality of fuses disposed on one or more layers of a die corresponding to said processor core.

14. The apparatus as recited in clam 13, wherein said plurality of fuses is programmed during fabrication of said processor core.

15. The apparatus as recited in claim 10, wherein said location-based multi-core/multi-package logic comprises a machine specific register, and wherein contents of said machine specific register are programmed via execution of instructions during reset of said processor core.

16. The apparatus as recited in claim 10, wherein said pull-up logic, when enabled, generates a termination impedance as specified for the bus, and wherein said termination impedance is generated to match a characteristic impedance of the bus.

17. A method for enabling a multi-core/multi-package environment on a bus, the bus requiring active termination impedance control, the method comprising:
  via a first node disposed within a processor core, receiving a first indication that a package upon which the processor core is disposed is internal to the bus or at a far end of the bus;
  via a location array disposed within a processor core, generating a second indication that one of a plurality of nodes is either internal to a bus or is at an end of the bus; and
  via location-based multi-core logic disposed within a driver, controlling how the one of a plurality of nodes is driven, said controlling comprising:
    if the first indication designates the package as internal to the bus, disabling pull-up logic and first enabling first pull-down logic and second pull-down logic;
    if the first indication designates the package as at the end of the bus and the second indication designates the one of a plurality of nodes as being internal to the bus, disabling pull-up logic and first enabling first pull-down logic and second pull-down logic; and
    if the first indication designates the package as at the end of the bus and the second indication designates the one of the plurality of nodes as being at the end of the bus, third enabling the pull-up logic and the first pull-down logic.

18. The method as recited in claim 17, wherein the location-based multi-core/multi-package logic comprises a plurality of fuses disposed on one or more layers of a die corresponding to the processor core.

19. The method as recited in clam 18, wherein the plurality of fuses is programmed during fabrication of the processor core.

20. The method as recited in claim 17, wherein the location-based multi-core/multi-package logic comprises a machine specific register, and wherein contents of the machine specific register are programmed via execution of instructions during reset of the processor core.

21. The method as recited in claim 17, wherein the pull-up logic, when enabled, generates a termination impedance as specified for the bus, and wherein the termination impedance is generated to match a characteristic impedance of the bus.

* * * * *